United States Patent
Kato et al.

(10) Patent No.: US 7,448,884 B2
(45) Date of Patent: Nov. 11, 2008

(54) ELECTRICAL COMPONENT WITH CONTACT TERMINAL PORTIONS ARRANGED IN GENERALLY TRAPEZOIDAL SHAPE

(75) Inventors: Nobukazu Kato, Tokyo (JP); Tomohiko Tamada, Tokyo (JP); Hidenobu Takahashi, Tokyo (JP); Kazushi Kamata, Aomori (JP); Toru Nomiyama, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 11/827,975

(22) Filed: Jul. 13, 2007

(65) Prior Publication Data

US 2008/0014803 A1    Jan. 17, 2008

(30) Foreign Application Priority Data

Jul. 14, 2006    (JP) .............................. 2006/194843

(51) Int. Cl.
*H01R 13/40* (2006.01)
(52) U.S. Cl. ..................................... 439/108
(58) Field of Classification Search ................ 439/108, 439/101
See application file for complete search history.

(56) References Cited

U.S. PATENT DOCUMENTS

| | | | |
|---|---|---|---|
| 6,692,272 B2* | 2/2004 | Lemke et al. ............... | 439/108 |
| 6,935,870 B2* | 8/2005 | Kato et al. .................. | 439/108 |
| 6,969,268 B2* | 11/2005 | Brunker et al. .............. | 439/108 |
| 7,303,410 B2* | 12/2007 | Saito ........................... | 439/108 |
| 2002/0123254 A1* | 9/2002 | Kato et al. .................. | 439/108 |
| 2004/0097112 A1* | 5/2004 | Minich et al. ............... | 439/101 |
| 2006/0092077 A1* | 5/2006 | Zhou .................. | 343/700 MS |
| 2006/0234531 A1* | 10/2006 | Winings et al. ............. | 439/108 |
| 2006/0246756 A1* | 11/2006 | Winings et al. ............. | 439/108 |
| 2007/0197088 A1* | 8/2007 | Lindkamp et al. ........... | 439/571 |

* cited by examiner

*Primary Examiner*—Gary F. Paumen
(74) *Attorney, Agent, or Firm*—Collard & Roe, P.C.

(57) ABSTRACT

In a connector adapted to be mounted on a connection object for connection to a mating connector, the connector includes contacts each of which has a contact portion placed on a contact portion side of the connector for connection to the mating connector and a terminal portion placed on a terminal portion side for connection to the connection object. The contacts have a plurality of signal contact members and a plurality of ground contact members. The signal contact members make a plurality of pairs. The ground contact members are arranged with spaces left therebetween. On the contact portion side, the pairs of the signal contact members are placed in the spaces, respectively. On the terminal portion side, the signal contact members and the ground contact members are separately arranged on parallel rows and the pairs of the signal contact members face the spaces, respectively.

12 Claims, 12 Drawing Sheets

ELECTRICAL COMPONENT WITH CONTACT TERMINAL PORTIONS ARRANGED IN GENERALLY TRAPEZOIDAL SHAPE

This application is based upon and claims the benefit of priority from Japanese patent application No. 2006-194843, filed on Jul. 14, 2006, the disclosure of which is incorporated herein in its entirely by reference.

BACKGROUND OF THE INVENTION

This invention relates to an electrical component such as a connector to be mounted on a connection object.

A connector generally has a terminal side for connection to a board or the like and a fitting side for connection to a mating connector. The connector comprises a plurality of conductive contacts each extending between the terminal side and the fitting side. Normally, the contacts are arranged so as to have the same pitch on the terminal side and the fitting side.

However, if the pitch of the contacts is the same on the terminal side and the fitting side, there may occur a case where mounting of the connector is difficult due to insufficient space. As a countermeasure therefor, there is a case where the contacts are regularly arranged in zigzag on the terminal side to have a staggered pattern.

SUMMARY OF THE INVENTION

There is a case where a connector is used for transmission of differential signals. In this case, contacts are divided into positive signal terminals for positive signals and negative signal terminals for negative signals, thereby forming differential pairs.

Referring to FIGS. 1 to 3, description will be given of some terminal arrangements obtained in the course of the research by the present inventors. In the figures, 51 denotes a fitting side of a connector, 52 a terminal side of the connector, S+ a positive signal terminal, S− a negative signal terminal, and G a ground terminal.

It is considered that the signal terminals S+ and S− surrounded by dotted-line ovals form differential pairs, respectively, on the terminal side 52 in the manner as shown in FIG. 1. However, in this case, transmission lines differ in cross section, which is far from ideal in terms of transmission performance. Therefore, there are drawbacks in terms of transmission quality such that impedance matching is difficult, crosstalk is large, and so on.

It is also considered that the signal terminals S+ and S− surrounded by dotted-line ovals form differential pairs, respectively, on the terminal side 52 in the manner as shown in FIG. 2. In this case, cross sections are the same in the differential pairs. However, since the signal terminals S+ and S− and the ground terminals G are arranged in one row on the fitting side 51, the signal terminals approach the signal terminals of the adjacent pairs, so that crosstalk is large. Further, there occurs a pair having a different cross section and thus there occurs a difference in transmission characteristics. Therefore, there are drawbacks in terms of transmission quality such that impedance matching is difficult, crosstalk is large, and so on.

It is also considered that the signal terminals S+ and S− surrounded by dotted-line ovals form differential pairs, respectively, on the terminal side 52 in the manner as shown in FIG. 3. In this case, all the differential pairs can be the same in cross section. However, the number of ground terminals increases, thus requiring additional space in a pitch direction.

It is therefore an exemplary object of this invention to provide an electrical connector and an electrical component that can improve the transmission quality in differential transmission.

It is another exemplary object of this invention to provide an electrical connector and an electrical component that can eliminate an unnecessary contact or contacts to reduce the number of contacts and thus save space.

Other objects of the present invention will become clear as the description proceeds.

According to an exemplary aspect of the present invention, there is provided a connector adapted to be mounted on a connection object for connection to a mating connector, wherein the connector comprises contacts each of which has a contact portion placed on a contact portion side of the connector for connection to the mating connector and a terminal portion placed on a terminal portion side for connection to the connection object, the contacts comprise a plurality of signal contact members and a plurality of ground contact members, the signal contact members making a plurality of pairs, the ground contact members being arranged with spaces left therebetween, on the contact portion side, the pairs of the signal contact members are placed in the spaces, respectively, and on the terminal portion side, the signal contact members and the ground contact members are separately arranged on parallel rows and the pairs of the signal contact members face the spaces, respectively.

According to another exemplary aspect of the present invention, there is provided an electrical component comprising a plurality of ground terminals, a plurality of signal terminals, and a fixing member fixing the ground and signal terminals, wherein the ground terminals and the signal terminals are fixed to the fixing member and, over a whole zone or in part thereof, with respect to a first direction, the ground terminal, the signal terminal, the signal terminal, and the ground terminal are arranged in the order named so that a central line between the two ground terminals and a central line between the signal terminals forming a differential pair are aligned with each other and, with respect to a second direction perpendicular to the first direction, an arrangement of the ground terminals and the signal terminals are divided into plural rows so that the ground terminals are arranged in one of the rows to have a space left between adjacent ones of the ground terminals and that the signal terminals forming the differential pair are arranged to face the space, thereby forming a trapezoidal array by the adjacent ones of the ground terminals and by the signal terminals forming the differential pair.

DESCRIPTION OF THE PREFERRED EMBODIMENTS

Referring to FIGS. 4 to 8, description will be given of an electrical connector as an electrical component according to a first exemplary embodiment of this invention.

Figure 1:
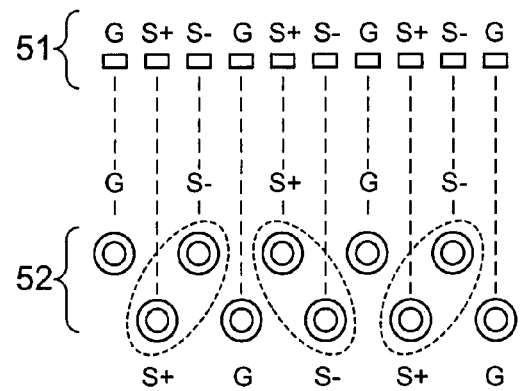
FIG. 1 is an explanatory diagram showing one example of a terminal arrangement obtained in the course of the research of this invention.
Figure 2:
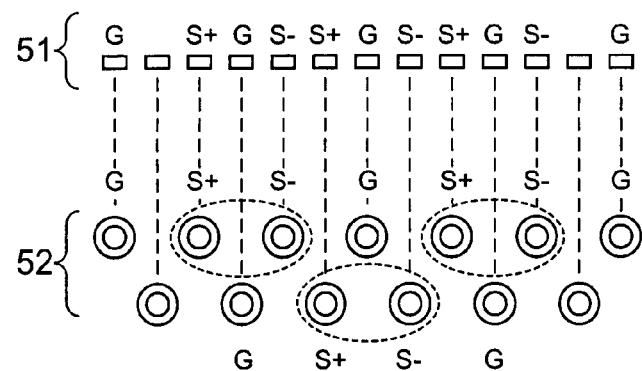
FIG. 2 is an explanatory diagram showing another example of a terminal arrangement obtained in the course of the research of this invention.
Figure 3:
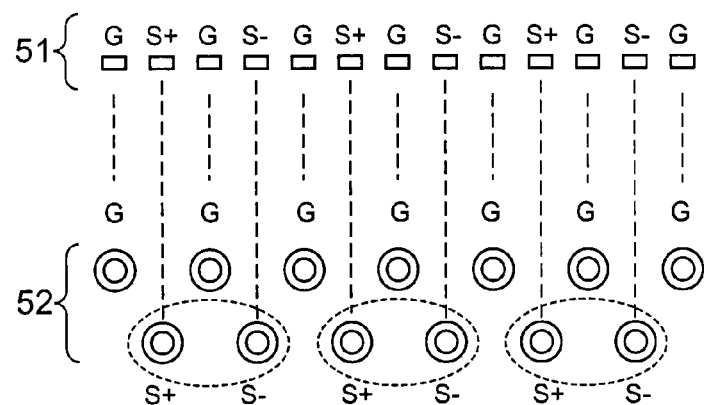
FIG. 3 is an explanatory diagram showing still another example of a terminal arrangement obtained in the course of the research of this invention.
Figure 4:
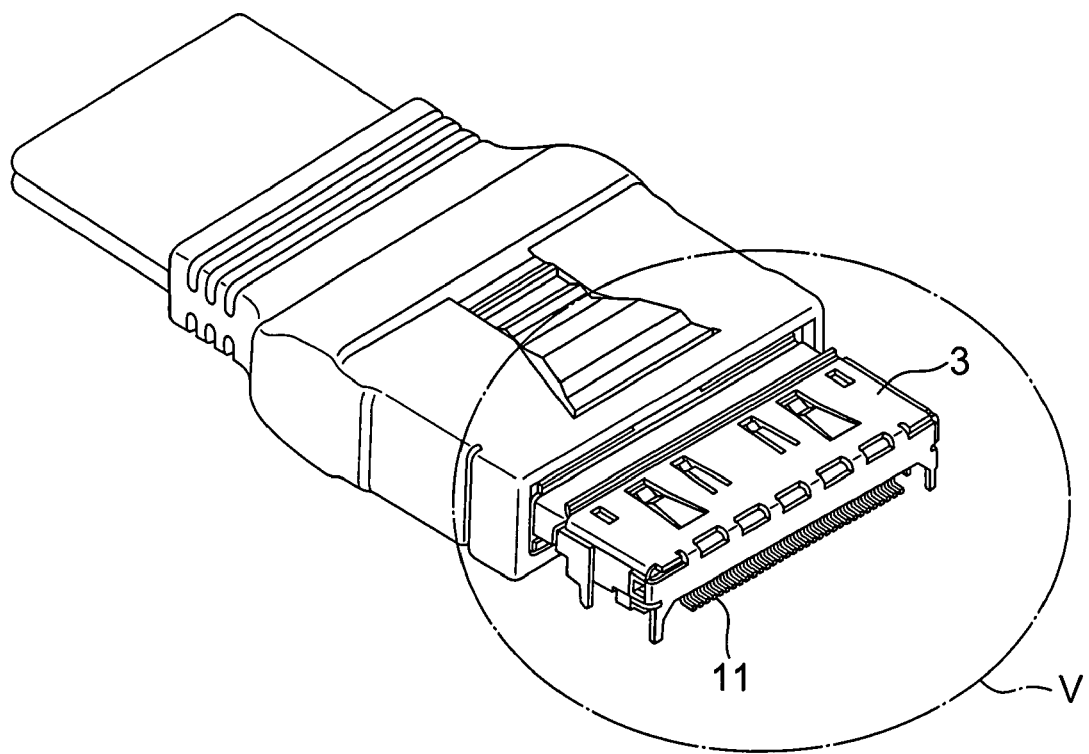
FIG. 4 is a perspective view of an electrical connector according to a first exemplary embodiment of this invention.
Figure 5:
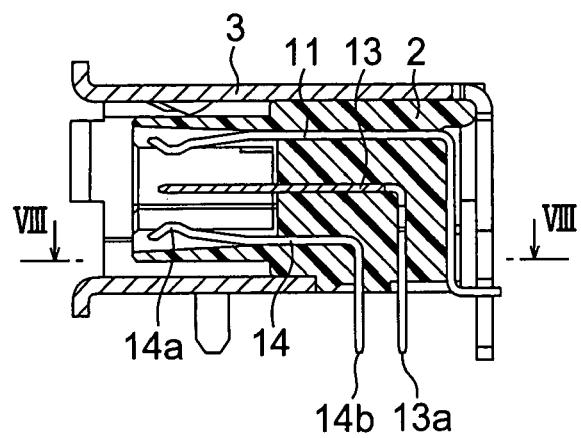
FIG. 5 is a sectional view of a main portion V of the electrical connector shown in FIG. 4.

The connector shown in FIGS. 4 and 5 is a receptacle connector which is used by being mounted on a connection object such as a printed circuit board and is adapted for connection to a mating connector. The connector comprises a number of contacts including upper conductive terminals 11 and lower conductive terminals 12, a housing 2 as an insulating fixing member holding the contacts, and a conductive shell or outer member 3 disposed outside the housing 2.

Figure 6:
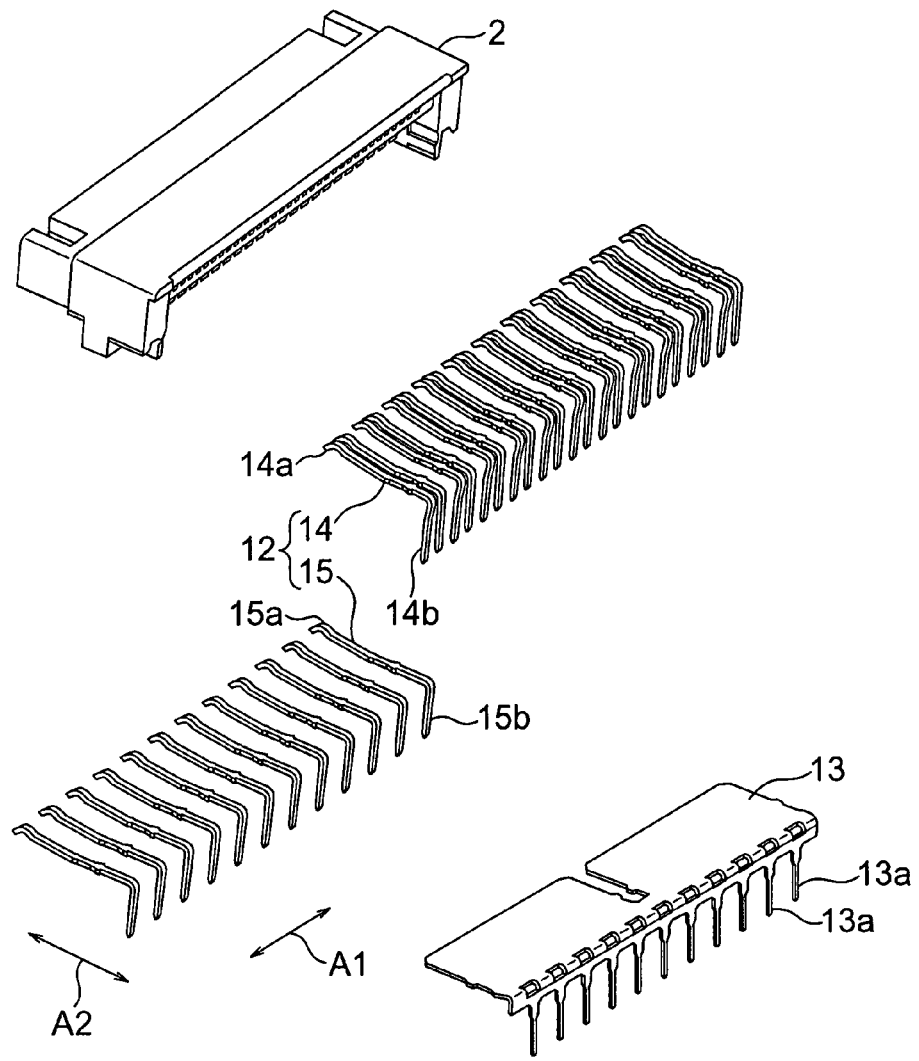
FIG. 6 is an exploded perspective view of the main portion V shown in FIG. 5.
Figure 6:
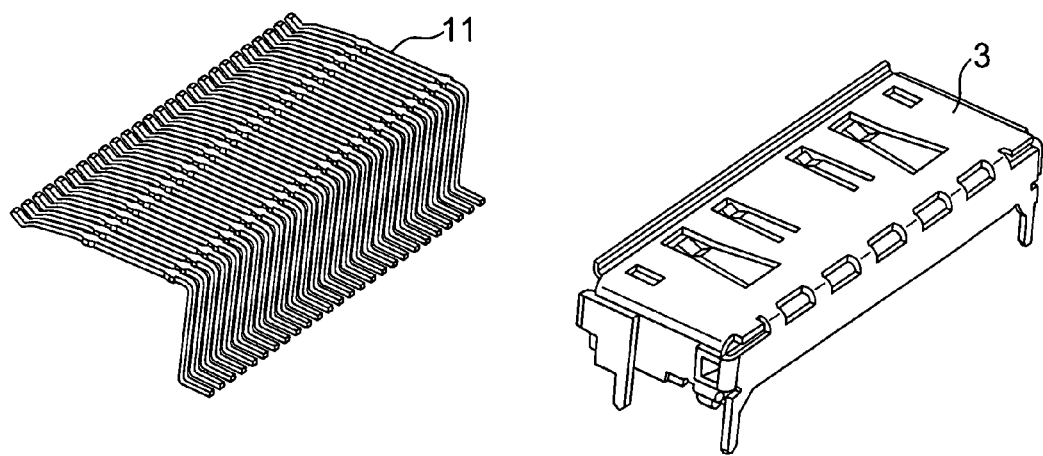

Referring also to FIG. 6 showing a disassembled state of a main portion V shown in FIG. 4, the description will be continued.

A conductive ground plate 13 is disposed between the upper terminals 11 and the lower terminals 12. The ground plate 13 is, of course, fixed to the housing 2. The upper terminals 11 are equal in shape and arranged in one row in a first direction A1.

Figure 7:
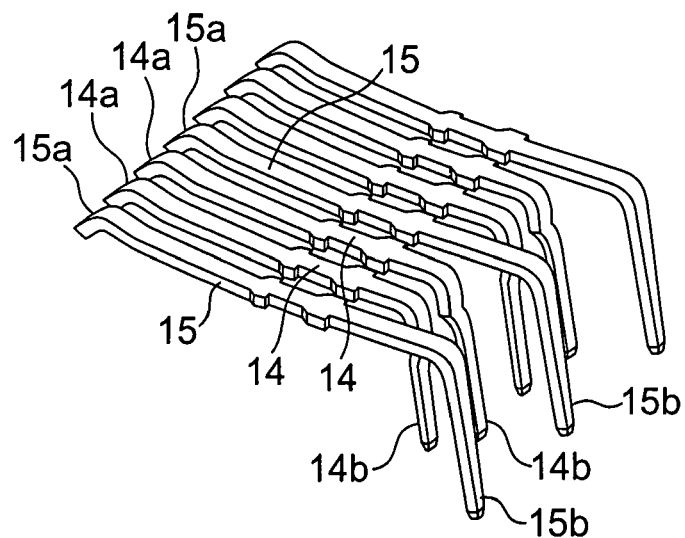
FIG. 7 is a perspective view showing a portion extracted from FIG. 5.

Referring also to FIG. 7, the lower terminals 12 have two kinds of shapes. That is, the lower terminals 12 comprise a plurality of signal contact members 14 and a plurality of ground contact members 15. Each signal contact member 14 has a signal contact portion 14a and a signal terminal 14b. Each ground contact member 15 has a ground contact portion 15a and a ground terminal 15b. The signal contact portions 14a and the ground contact portions 15a are arranged in one row in the first direction A1. The signal terminals 14b and the ground terminals 15b are separately arranged in two rows spaced apart from each other in a second direction A2 perpendicular to the first direction A1.

Further, the signal contact members 14 form pairs, respectively. The signal contact portions 14a of the signal contact members 14 of each pair are disposed between the ground contact portions 15a of the two ground contact members 15 in the first direction A1. That is, on the contact portion side, the signal contact members 14 and the ground contact members 15 are arranged in the same row so as to sandwich each pair of signal contact members 14 between the adjacent ground contact members 15.

On the other hand, the signal terminals 14b of the signal contact members 14 of each pair are correspondingly disposed between the ground terminals 15b of the two ground contact members 15. That is, on the terminal side, each pair of signal contact members 14 are opposed to an interval between the adjacent ground contact members 15 in the second direction A2, thereby forming a substantially trapezoidal array, i.e. a trapezoidal or approximately trapezoidal array, which will be described in detail later. A plurality of substantially trapezoidal arrays are repeatedly formed in the first direction A1 and the ground terminals 15b are each shared between the adjacent substantially trapezoidal arrays.

The ground plate 13 extends parallel to the plane where the ground contact members 15 and the signal contact members 14 are arranged in the housing 2, so as to maintain a predetermined distance from such a plane. The ground plate 13 has ground terminal portions 13a for connection to the connection object. In a zone where the ground terminals 15b and the signal terminals 14b form the substantially trapezoidal arrays, the ground terminal portions 13a are each disposed between the adjacent ground terminals 15b so that the ground terminals 15b and the ground terminal portions 13a are arranged on the same line at an equal pitch. This makes it possible to provide the ground plate 13 without increasing the mounting area.

Figure 8:
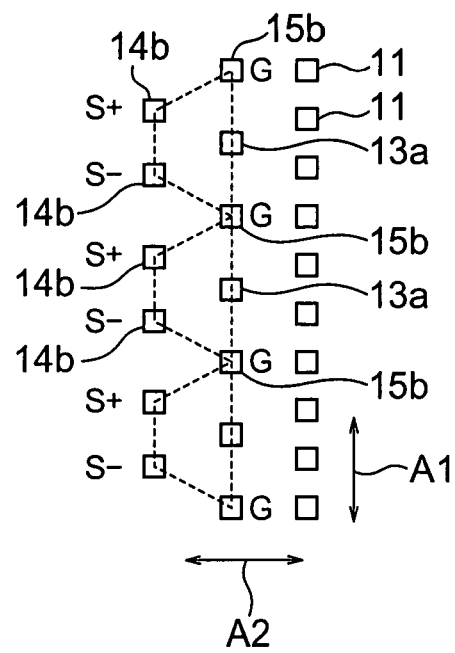
FIG. 8 is an explanatory diagram showing a terminal arrangement of the electrical connector shown in FIGS. 4 to 7.
Figure 9:
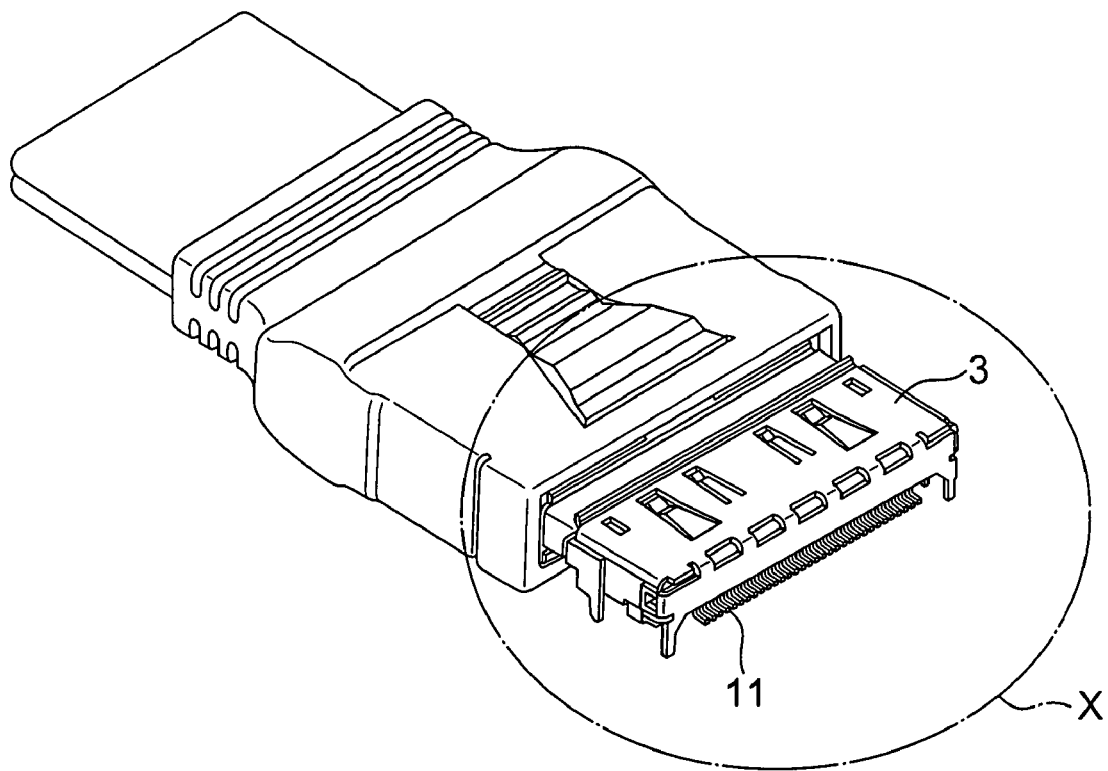
FIG. 9 is a perspective view of an electrical connector according to a second exemplary embodiment of this invention.

FIG. 8 shows the connection position relationship of the upper terminals 11, the signal contact members 14, and the ground contact members 15 with respect to the connection object. In the figure, S+ and S− indicate positions of the signal terminals 14b of the paired signal contact members 14 and G indicates a position of the ground terminal 15b.

From FIG. 8, it is understood that, at the connecting portion with the connection object, i.e. on the terminal side, the signal contact members 14 and the ground contact members 15 are separately arranged in two rows and each pair of signal contact members 14 are correspondingly disposed between the adjacent ground contact members 15, thereby forming the substantially trapezoidal array. At the fitting portion of the connector, i.e. on the contact portion side, the signal contact members 14 and the ground contact members 15 are arranged in one row in the first direction A1.

In other words, the foregoing connector is configured such that, with respect to the first direction A1, the ground terminal 15b, the signal terminal 14b, the signal terminal 14b, and the ground terminal 15b are arranged in the order named so that a central line between the two ground terminals 15b and a central line between the signal terminals 14b forming the differential pair are aligned with each other and, with respect to the second direction A2, the arrangement of the ground terminals 15b and the signal terminals 14b is divided into two rows so that the two ground terminals 15b are arranged in one of the rows and the signal terminals 14b forming the differential pair are arranged in the other row.

Referring to FIGS. 9 to 12, the description will be given of an electrical connector as an electrical component according to a second exemplary embodiment of this invention. The same reference symbols are assigned to the same portions as those of the electrical connector described with reference to FIGS. 4 to 8, thereby omitting explanation thereof.

In this electrical connector, the ground plate 13 provided in the electrical connector of FIGS. 4 to 8 is omitted. Even in this case, signal terminals 14b of signal contact members 14 of each pair are correspondingly disposed between ground terminals 15b of two ground contact members 15. That is, on the terminal side, each pair of signal contact members 14 are opposed to an interval between the adjacent ground contact members 15 in the second direction A2, thereby forming a substantially trapezoidal array. A plurality of substantially trapezoidal arrays are repeatedly formed in the first direction A1 and the ground terminals 15b are each shared between the adjacent substantially trapezoidal arrays.

According to this electrical connector, by sharing each ground terminal 15b between the adjacent substantially trapezoidal arrays, it is possible to provide the same cross section in and between the differential pairs on the lower side over the whole zone without increasing unnecessary contacts or space, thus capable of improving the transmission quality in differential transmission.

Referring to FIGS. 13 to 17, the description will be given of an electrical connector as an electrical component according to a third exemplary embodiment of this invention. The same reference symbols are assigned to the same portions as those of the electrical connector described with reference to FIGS. 4 to 8, thereby omitting explanation thereof.

In this electrical connector, the outer member 3 and the upper terminals 11 provided in the electrical connector of FIGS. 9 to 12 are omitted. Even in this case, signal terminals 14b of signal contact members 14 of each pair are correspondingly disposed between ground terminals 15b of two ground contact members 15. That is, on the terminal side, each pair of signal contact members 14 are opposed to an interval between the adjacent ground contact members 15 in the second direction A2, thereby forming a substantially trapezoidal array. A plurality of substantially trapezoidal arrays are repeatedly formed in the first direction A1 and the ground terminals 15b are each shared between the adjacent substantially trapezoidal arrays.

According to this electrical connector, by sharing each ground terminal 15b between the adjacent substantially trapezoidal arrays, it is possible to provide the same cross section in and between the differential pairs of signal contact members 14 over the whole zone without increasing unnecessary contacts or space, thus capable of improving the transmission quality in differential transmission.

Referring to FIGS. 18 to 22, the description will be given of an electrical connector as an electrical component according to a fourth exemplary embodiment of this invention. The same reference symbols are assigned to the same portions as those of the electrical connector described with reference to FIGS. 13 to 17, thereby omitting explanation thereof.

In this electrical connector, the number of signal contact members 14 and the number of ground contact members 15 are reduced as compared with the electrical connector of FIGS. 13 to 17. That is, two signal contact members 14 and two ground contact members 15 are used. Even in this case, signal terminals 14b of the pair of signal contact members 14 are correspondingly disposed between ground terminals 15b of the two ground contact members 15. That is, on the terminal side, the pair of signal contact members 14 are opposed to an interval between the ground contact members 15 in the second direction A2, thereby forming a substantially trapezoidal array.

According to this electrical connector, it is possible to provide the same cross section in the differential pair of signal contact members 14 over the whole zone, thus capable of improving the transmission quality in differential transmission.

Figure 23:
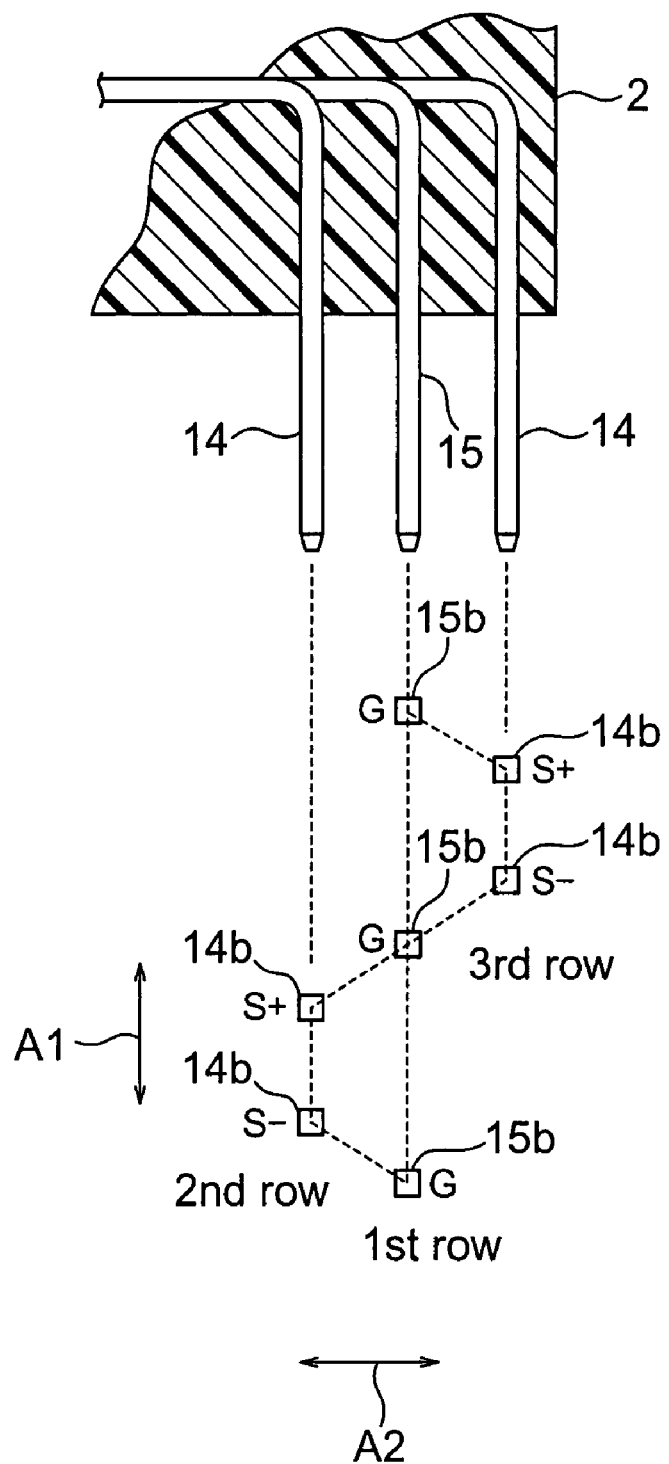
FIG. 23 shows, together with a terminal arrangement, a partial view for describing an electrical connector according to a fifth exemplary embodiment of this invention.

Referring to FIG. 23 together with FIGS. 5 and 10, the description will be given of an electrical connector as an electrical component according to a fifth exemplary embodiment of this invention. Similar parts or portions are designated by the like reference numerals, thereby omitting explanation thereof.

Figure 10:
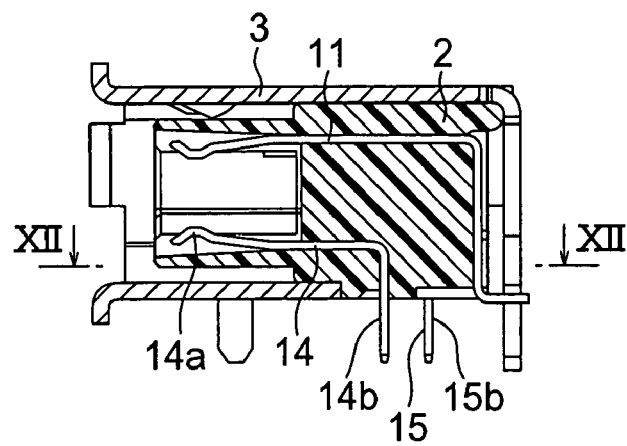
FIG. 10 is a sectional view of a main portion X of the electrical connector shown in FIG. 9.
Figure 11:
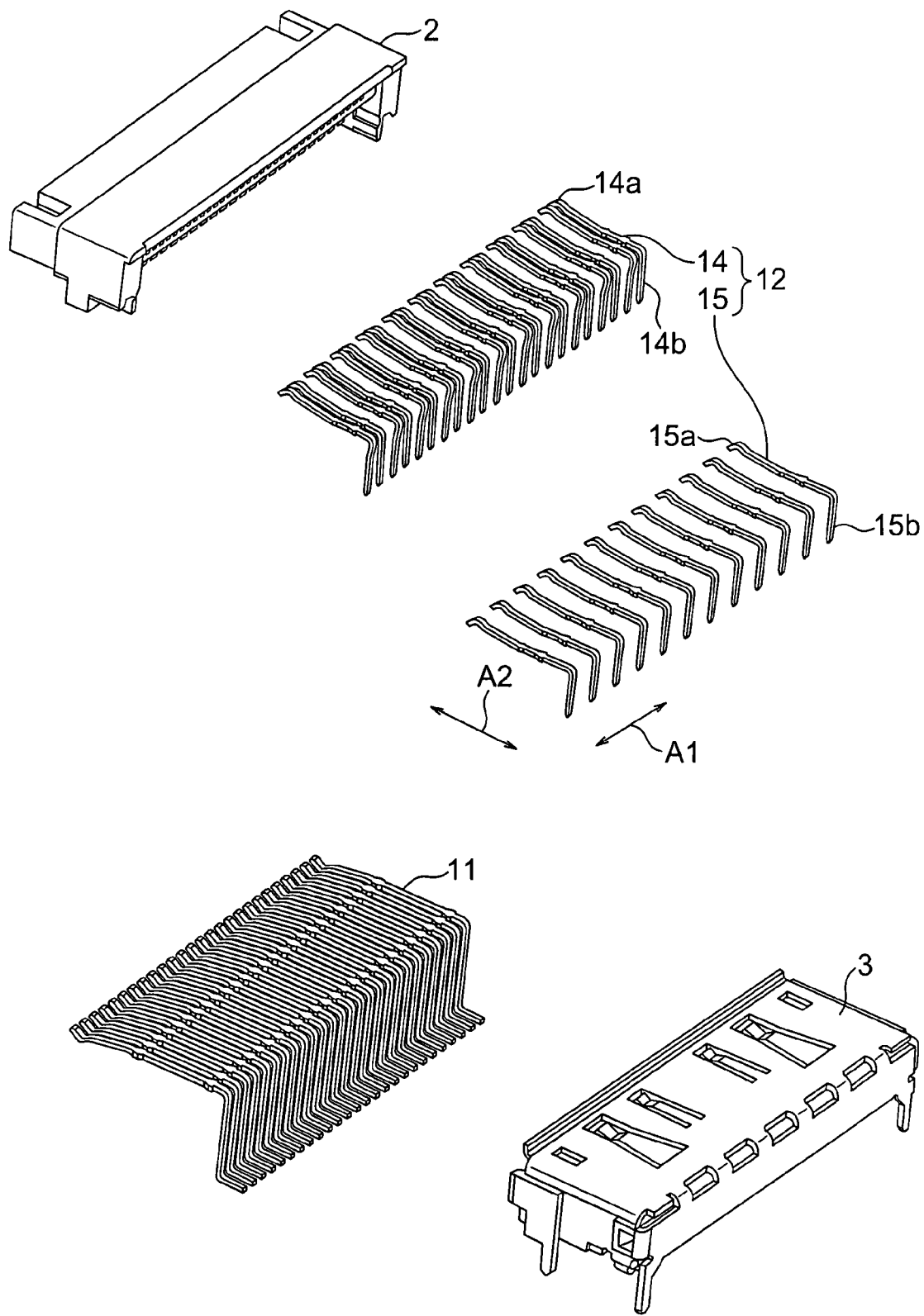
FIG. 11 is an exploded perspective view of the main portion X shown in FIG. 10.
Figure 12:
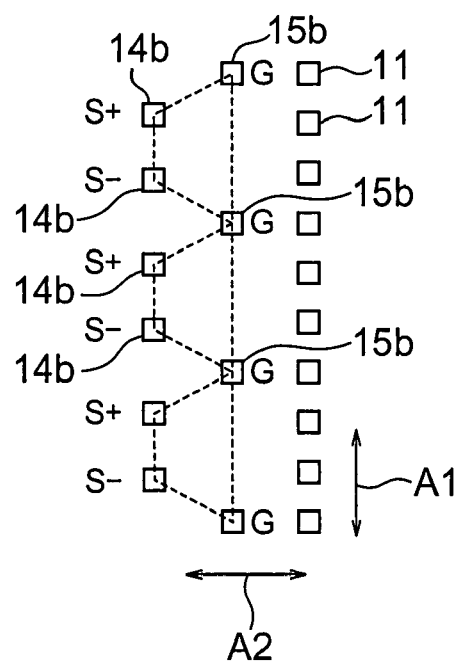
FIG. 12 is an explanatory diagram showing a terminal arrangement of the electrical connector shown in FIGS. 9 to 11.
Figure 13:
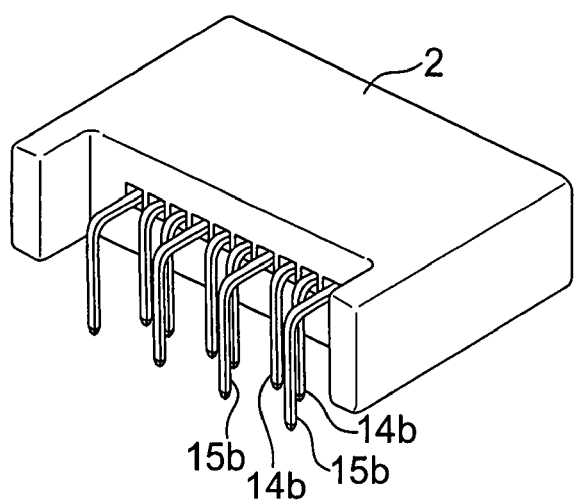
FIG. 13 is a perspective view of an electrical connector according to a third exemplary embodiment of this invention.
Figure 14A:
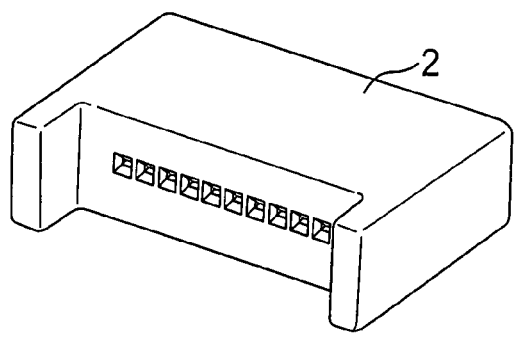
FIGS. 14A and 14B are perspective views, as seen from mutually different directions, respectively, of a housing of the electrical connector shown in FIG. 13.
Figure 14B:
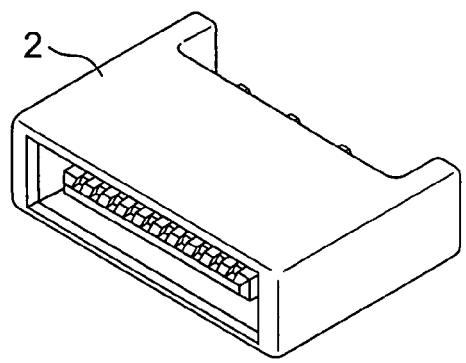
Figure 15:
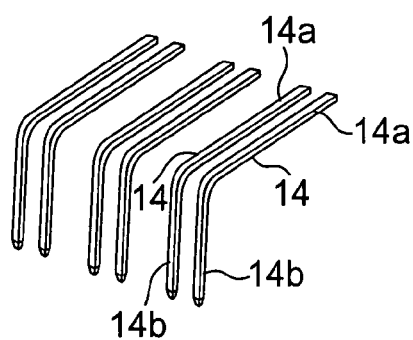
FIG. 15 is a perspective view showing signal contact members of the electrical connector shown in FIG. 13.
Figure 16:
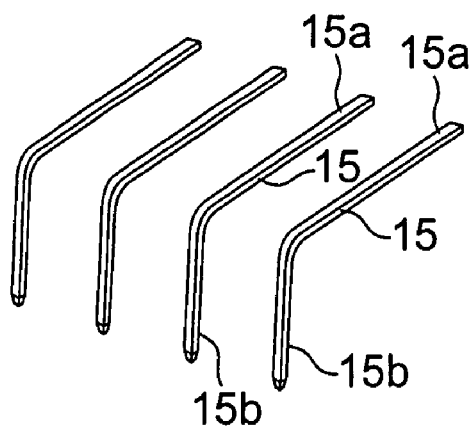
FIG. 16 is a perspective view showing ground contact members of the electrical connector shown in FIG. 13.
Figure 17:
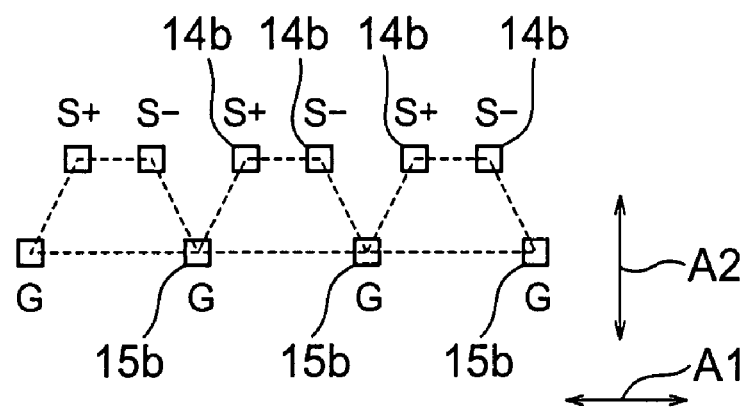
FIG. 17 is an explanatory diagram showing a terminal arrangement of the electrical connector shown in FIG. 12.
Figure 18:
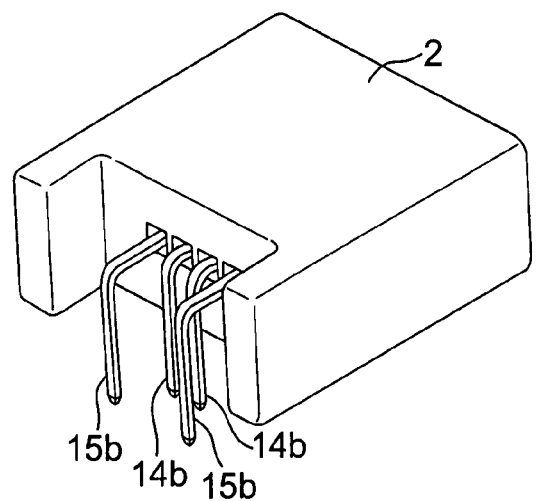
FIG. 18 is a perspective view of an electrical connector according to a fourth exemplary embodiment of this invention.
Figure 19A:
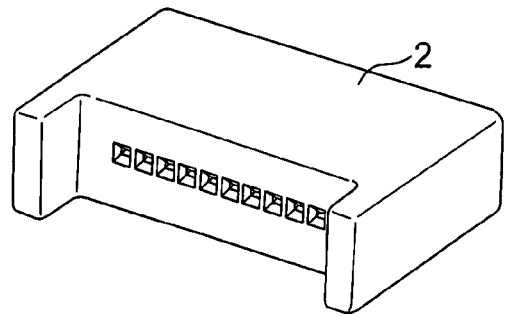
FIGS. 19A and 19B are perspective views, as seen from mutually different directions, respectively, of a housing of the electrical connector shown in FIG. 18.
Figure 19B:
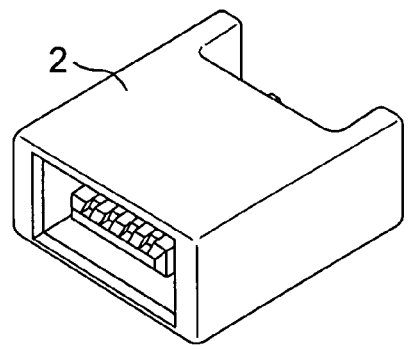
Figure 20:
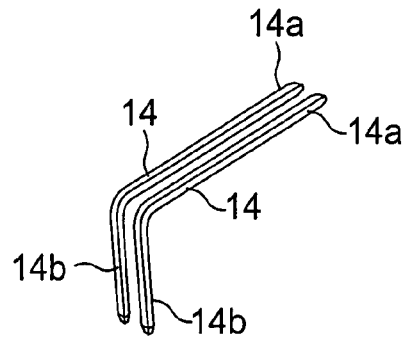
FIG. 20 is a perspective view showing signal contact members of the electrical connector shown in FIG. 18.
Figure 21:
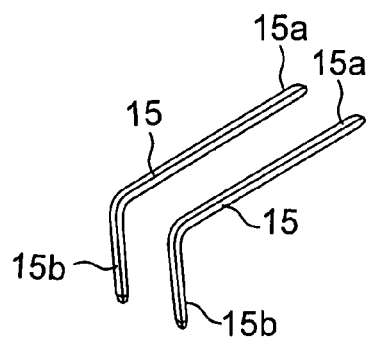
FIG. 21 is a perspective view showing ground contact members of the electrical connector shown in FIG. 18.
Figure 22:
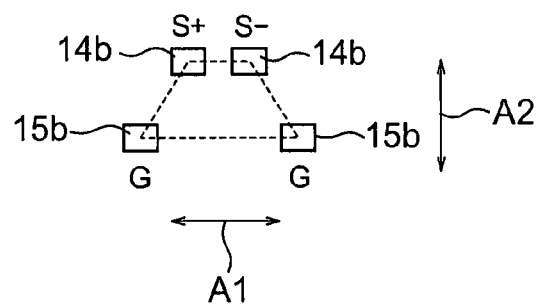
FIG. 22 is an explanatory diagram showing a terminal arrangement of the electrical connector shown in FIG. 18.

Similar to the electrical connectors illustrated in FIGS. 5 and 10, the signal contact members 14 make a plurality of pairs indicated by S+ and S−. The ground contact members 15 are arranged with spaces left therebetween. On the contact portion side (not shown), the pairs of the signal contact members 14 are respectively placed in the spaces that are between the ground contact members 15.

On the terminal portion side shown in FIG. 23, the signal terminals 14b of the signal contact members 14 and the ground terminals 15b of the ground contact members 15 are separately arranged on parallel rows. More particularly, the ground terminals 15b are arranged on a first row in the first direction A1, while the signal terminals 14b are arranged on a second and a third row which are parallel to the first row and separated on both sides of the first row in the second direction A2, respectively.

It is noted here that the signal terminals 14b are divided into first and second groups. The signal terminals 14b of the first group are arranged on the second row. The signal terminals 14b of the second group are arranged on the third row. This means that the signal contact members 14 having the signal terminals 14b of the second group are extended in the second direction A2 relative to the signal contact members 14 having the signal terminals 14b of the first group.

Similar to the electrical connectors illustrated in FIGS. 5 and 10, the signal terminals 14b of the pairs of the signal contact members 14 respectively face the spaces that are between the ground terminals 15b. The signal terminals 14b and the ground terminals 15b associate to form at least two substantially trapezoidal arrays.

In the manner shown in FIG. 23, the at least two substantially trapezoidal arrays are alternately arranged or staggered along the first row on that the ground terminals 15b are arranged. In this respect, the electrical connector of FIG. 23 is clearly different from the above-mentioned electrical connectors in that the substantially trapezoidal arrays are arranged only on one side of the row of the ground terminals 15b.

In any of the foregoing electrical connectors, since the ground terminals and the signal terminals are arranged in different rows and are further configured to form a substantially trapezoidal array or arrays, it is possible to provide the same cross section in and between the differential pairs to thereby improve the transmission quality of differential signals and is further possible to eliminate unnecessary contacts and thus save space. Further, by forming the substantially trapezoidal array or arrays over the whole zone or in part thereof of the electrical component adapted to transmit differential signals, the distance between the ground terminals and the signal terminals can be maintained at a constant distance suitable for impedance matching.

In the foregoing description of the respective electrical connectors, "the whole zone" represents a zone from one end to the other in the arrangement direction (A1) of the contacts. Further, "the same cross section" represents that a section is taken in the direction perpendicular to the axial direction of the contacts being the left-right direction in FIG. 5, i.e. perpendicular to the direction of fitting/removal to/from a mating connector, and the two signal contacts in the pair have the same sectional shape or the two ground contacts corresponding to the pair have the same sectional shape.

While the present invention has thus far been described in connection with a few embodiments thereof, it will readily be possible for those skilled in the art to put this invention into practice in various other manners.

What is claimed is:

1. A connector adapted to be mounted on a connection object for connection to a mating connector, wherein:
    the connector comprises contacts each of which has a contact portion placed on a contact portion side of the connector for connection to the mating connector and a terminal portion placed on a terminal portion side for connection to the connection object,
    the contacts comprise a plurality of signal contact members and a plurality of ground contact members, the signal contact members making a plurality of pairs, the ground contact members being arranged with spaces left therebetween,
    on the contact portion side, the pairs of the signal contact members are placed in the spaces, respectively, and
    on the terminal portion side, the signal contact members and the ground contact members are separately arranged on parallel rows, the pairs of the signal contact members face the spaces, respectively, and the signal contact members and the ground contact members form at least one trapezoidal array on one side of the first row.

2. The connector according to claim 1, wherein, on the terminal portion side, the ground contact members are arranged on a first row and the signal contact members are arranged on a second row parallel to the first row.

3. The connector according to claim 1, wherein, on the terminal portion side, the ground contact members are arranged on a first row and the pairs of the signal contact members are arranged on a second and a third row which are parallel to the first row and placed on both sides of the first row, respectively, whereby the signal contact members and the ground contact members form at least two trapezoidal arrays on both side of the first row.

4. The connector according to claim 3, wherein the at least two trapezoidal arrays are staggered along the first row.

5. The connector according to claim 1, further comprising:
    a housing holding the contacts; and
    a ground plate held by the housing and having a ground terminal portion for connection to the connection object.

6. The connector according to claim 5, wherein the ground terminal portion is disposed between the terminal portions of the ground contact members.

7. The connector according to claim 5, wherein the contacts comprise a lower conductive terminal disposed on one side of the ground plate.

8. The connector according to claim 7, wherein the contacts further comprise an upper conductive terminal, the ground plate is disposed between the upper conductive terminal and the lower conductive terminals.

9. An electrical component comprising a plurality of ground terminals, a plurality of signal terminals, and a fixing member fixing the ground and signal terminals,
    wherein the ground terminals and the signal terminals are fixed to the fixing member and, over a whole zone or in part thereof, with respect to a first direction, the ground terminal, the signal terminal, the signal terminal, and the ground terminal are arranged in the order named so that a central line between the two ground terminals and a central line between the signal terminals forming a differential pair are aligned with each other and, with respect to a second direction perpendicular to the first direction, an arrangement of the ground terminals and the signal terminals are divided into plural rows so that the ground terminals are arranged in one of the rows to have a space left between adjacent ones of the ground terminals and that the signal terminals forming the differential pair are arranged to face the space, thereby forming a trapezoidal array by the adjacent ones of the ground terminals and by the signal terminals forming the differential pair.

10. The electrical component according to claim 9, wherein, over the whole zone or in part thereof, a plurality of substantially trapezoidal arrays are repeatedly formed in the first direction and the ground terminal is shared between the adjacent substantially trapezoidal arrays.

11. An electrical connector comprising the electrical component according to claim 9.

12. The electrical connector according to claim 11, wherein, over the whole zone or in part thereof, a plurality of substantially trapezoidal arrays are repeatedly formed in the first direction and the ground terminal is shared between the adjacent substantially trapezoidal arrays.

* * * * *